(12) United States Patent
Galdys

(10) Patent No.: US 12,319,201 B2
(45) Date of Patent: Jun. 3, 2025

(54) VEHICULAR REARVIEW MIRROR ASSEMBLY WITH CAMERAS

(71) Applicant: Magna Mirrors of America, Inc., Holland, MI (US)

(72) Inventor: Michael J. Galdys, Wyoming, MI (US)

(73) Assignee: Magna Mirrors of America, Inc., Holland, MI (US)

( * ) Notice: Subject to any disclaimer, the term of this patent is extended or adjusted under 35 U.S.C. 154(b) by 45 days.

(21) Appl. No.: 18/193,664

(22) Filed: Mar. 31, 2023

(65) Prior Publication Data

US 2023/0311765 A1  Oct. 5, 2023

Related U.S. Application Data

(60) Provisional application No. 63/362,343, filed on Apr. 1, 2022.

(51) Int. Cl.
*B60R 1/12* (2006.01)
*B60Q 1/24* (2006.01)
(Continued)

(52) U.S. Cl.
CPC ............... *B60R 1/12* (2013.01); *B60R 1/074* (2013.01); *B60R 1/1207* (2013.01); *B60R 16/0207* (2013.01); *B60S 1/56* (2013.01); *G02B 27/0006* (2013.01); *G03B 17/561* (2013.01); *G06V 20/58* (2022.01); *H04N 7/181* (2013.01);
(Continued)

(58) Field of Classification Search
CPC ......... B60R 1/12; B60R 1/074; B60R 1/1207; B60R 16/0207; B60R 1/26; B60R 2001/1253; B60S 1/56; B60S 1/52; B60S 1/60; G02B 27/0006; G03B 17/561; G06V 20/58; H04N 7/181; H04N 23/51; H04N 23/52; H04N 23/90; H05K 5/0026;
(Continued)

(56) References Cited

U.S. PATENT DOCUMENTS 5,550,677 A  8/1996  Schofield et al.
5,670,935 A  9/1997  Schofield et al.
(Continued)

FOREIGN PATENT DOCUMENTS

KR  20200058685 A  *  5/2020  ......... H04N 5/23299

*Primary Examiner* — Michael Lee
(74) *Attorney, Agent, or Firm* — HONIGMAN LLP

(57) ABSTRACT

A vehicular exterior rearview mirror assembly includes a mirror head accommodating a mirror reflective element. The mirror head is adjustably mounted at a mounting base configured for attachment at a side of a vehicle. A plurality of cameras are disposed at the mounting base and includes (i) a rearward viewing camera that views at least rearward of the vehicle and (ii) a downward viewing camera that views at least downward. The mirror head accommodates an electronic accessory. A wire harness passing through the mounting base to the mirror head includes individual wires that terminate at respective first, second, and third electrical connectors. The accessory is electrically connected to a power source of the vehicle via the first connector. The rearward and downward viewing cameras respectively connect to the second and third connectors to receive electrical power from the power source and provide image data to an electronic control unit.

33 Claims, 9 Drawing Sheets

(51) Int. Cl.
*B60R 1/074* (2006.01)
*B60R 1/26* (2022.01)
*B60R 16/02* (2006.01)
*B60S 1/52* (2006.01)
*B60S 1/56* (2006.01)
*G02B 27/00* (2006.01)
*G03B 17/56* (2021.01)
*G06V 20/58* (2022.01)
*H04N 7/18* (2006.01)
*H04N 23/51* (2023.01)
*H04N 23/52* (2023.01)
*H04N 23/90* (2023.01)
*H05K 5/00* (2025.01)

(52) U.S. Cl.
CPC ............ *H04N 23/51* (2023.01); *H04N 23/52* (2023.01); *H04N 23/90* (2023.01); *H05K 5/0026* (2013.01); *B60Q 1/245* (2013.01); *B60Q 1/247* (2022.05); *B60Q 2400/50* (2013.01); *B60R 2001/1253* (2013.01); *B60R 1/26* (2022.01); *B60S 1/52* (2013.01)

(58) Field of Classification Search
CPC .... B60Q 1/245; B60Q 1/247; B60Q 2400/50; B60Q 1/2665
See application file for complete search history.

(56) References Cited

U.S. PATENT DOCUMENTS

| | | | |
|---|---|---|---|
| 5,760,962 A | 6/1998 | Schofield et al. | |
| 5,786,772 A | 7/1998 | Schofield et al. | |
| 5,796,094 A | 8/1998 | Schofield et al. | |
| 5,929,786 A | 7/1999 | Schofield et al. | |
| 6,097,023 A | 8/2000 | Schofield et al. | |
| 6,198,409 B1 | 3/2001 | Schofield et al. | |
| 6,201,642 B1 | 3/2001 | Bos | |
| 6,313,454 B1 | 11/2001 | Bos et al. | |
| 6,353,392 B1 | 3/2002 | Schofield et al. | |
| 6,396,397 B1 | 5/2002 | Bos et al. | |
| 6,498,620 B2 | 12/2002 | Schofield et al. | |
| 6,717,610 B1 | 4/2004 | Bos et al. | |
| 6,757,109 B2 | 6/2004 | Bos | |
| 6,882,287 B2 | 4/2005 | Schofield | |
| 7,005,974 B2 | 2/2006 | McMahon et al. | |
| 7,038,577 B2 | 5/2006 | Pawlicki et al. | |
| 7,492,281 B2 | 2/2009 | Lynam et al. | |
| 7,581,859 B2 | 9/2009 | Lynam | |
| 7,626,749 B2 | 12/2009 | Baur et al. | |
| 7,720,580 B2 | 5/2010 | Higgins-Luthman | |
| 7,881,496 B2 | 2/2011 | Camilleri et al. | |
| 7,994,371 B2 | 8/2011 | Bektesevic et al. | |
| 8,242,896 B2 | 8/2012 | Lynam | |
| 8,764,256 B2 | 7/2014 | Foote et al. | |
| 8,915,601 B2 | 12/2014 | Foote et al. | |
| 8,982,273 B2 | 3/2015 | Bingle et al. | |
| 9,346,403 B2 | 5/2016 | Uken et al. | |
| 9,487,142 B2 | 11/2016 | Sobecki et al. | |
| 9,827,913 B2 | 11/2017 | De Wind et al. | |
| 10,046,706 B2 | 8/2018 | Larson et al. | |
| 10,099,618 B2 | 10/2018 | Foote et al. | |
| 10,442,360 B2 | 10/2019 | LaCross et al. | |
| 10,576,896 B2 | 3/2020 | Huizen et al. | |
| 10,640,042 B2 | 5/2020 | Lu et al. | |
| 10,894,275 B2 | 1/2021 | Byrne et al. | |
| 11,242,008 B2 | 2/2022 | Blank et al. | |
| 11,325,535 B2 | 5/2022 | Foote et al. | |
| 2012/0158243 A1* | 6/2012 | Pupin ................... | H04N 7/181 348/148 |
| 2014/0285666 A1* | 9/2014 | O'Connell ............. | B60R 1/28 348/148 |
| 2014/0376119 A1* | 12/2014 | Sobecki ................ | B60R 1/082 359/841 |
| 2016/0243988 A1* | 8/2016 | Peterson ............... | B60R 1/0617 |
| 2016/0264064 A1 | 9/2016 | Byrne et al. | |
| 2016/0272163 A1 | 9/2016 | Dreiocker et al. | |
| 2017/0210297 A1* | 7/2017 | Kim ...................... | G01S 17/931 |
| 2018/0134217 A1 | 5/2018 | Peterson et al. | |
| 2019/0118717 A1 | 4/2019 | Blank et al. | |
| 2020/0223364 A1 | 7/2020 | Peterson et al. | |
| 2020/0353867 A1 | 11/2020 | Huizen et al. | |
| 2021/0155167 A1 | 5/2021 | Lynam et al. | |
| 2021/0162926 A1 | 6/2021 | Lu | |
| 2021/0213880 A1 | 7/2021 | Esser | |
| 2021/0316664 A1 | 10/2021 | Baur | |
| 2021/0331625 A1 | 10/2021 | Huizen et al. | |
| 2024/0064274 A1 | 2/2024 | Blank et al. | |

* cited by examiner

VEHICULAR REARVIEW MIRROR ASSEMBLY WITH CAMERAS

CROSS REFERENCE TO RELATED APPLICATION

The present application claims the filing benefits of U.S. provisional application Ser. No. 63/362,343, filed Apr. 1, 2022, which is hereby incorporated herein by reference in its entirety.

FIELD OF THE INVENTION

The present disclosure relates generally to the field of exterior rearview mirror assemblies for vehicles.

BACKGROUND OF THE INVENTION

It is known to provide an automotive rearview mirror assembly that includes one or more accessories, such as a light source or blind spot indicator or camera or the like.

SUMMARY OF THE INVENTION

A vehicular exterior rearview mirror assembly (such as an exterior mirror assembly mounted at a side of an equipped vehicle) includes a mirror head adjustably disposed at a support arm or mounting base coupled to a side of a vehicle and a plurality of cameras that capture image data for one or more vision systems of the vehicle. An electronic control unit (ECU) may be disposed at the vehicle. The ECU includes electronic circuitry and associated software. The plurality of vehicle cameras are disposed at the support arm. The plurality of vehicle cameras may include (i) a rearward viewing vehicle camera viewing at least rearward and along the side of the vehicle and (ii) a downward viewing vehicle camera viewing at least sideward and downward toward the ground along the side of the vehicle. Each camera of the plurality of vehicle cameras captures image data and provides captured image data to the ECU. The cameras may be electrically connected to a power source of the vehicle and the ECU via an electrical connector that is routed along the mounting base of the mirror assembly. The electrical connector may also supply electrical power to one or more electronic devices accommodated by the mirror head, such as a powerfold actuator, a heater of the mirror reflective element, a light source for a turn signal indicator or blind spot indicator, and/or the like.

These and other objects, advantages, purposes and features of the present disclosure will become apparent upon review of the following specification in conjunction with the drawings.

DESCRIPTION OF THE PREFERRED EMBODIMENTS

Figure 1:
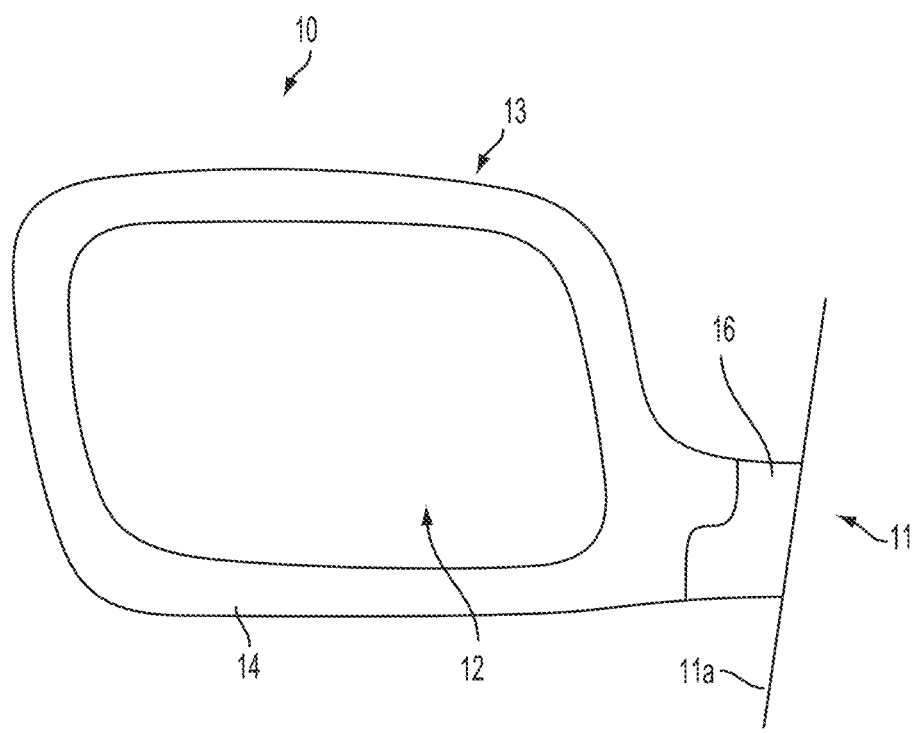
FIG. 1 is a view of an exterior rearview mirror assembly disposed at the side of a vehicle.

Referring now to the drawings and the illustrative embodiments depicted therein, an exterior rearview mirror assembly 10 for a vehicle 11 includes a mirror head 13 that includes a mirror reflective element 12 received in and/or supported at or by a mirror shell or casing 14 of the mirror head portion 13 (FIG. 1). The mirror head portion 13 includes a mounting portion that may be fixedly attached at a mounting arm or base 16 at the side of the vehicle or the mounting portion may be pivotally or movably mounted to the mounting arm or base or portion 16. The mirror assembly 10 may comprise a powerfold mirror (where the mirror head portion may be pivoted via an actuator assembly or adjustment device), and/or may comprise a breakaway mirror (where the mirror head portion may be manually pivoted about the mounting arm or base). The mounting arm or base or support arm 16 of the mirror assembly 10 is mounted at the side 11a of the host or subject vehicle 11 equipped with the mirror assembly 10, with the reflective element 12 providing a rearward field of view along the respective side of the vehicle to the driver of the vehicle, as discussed below.

Figure 2:
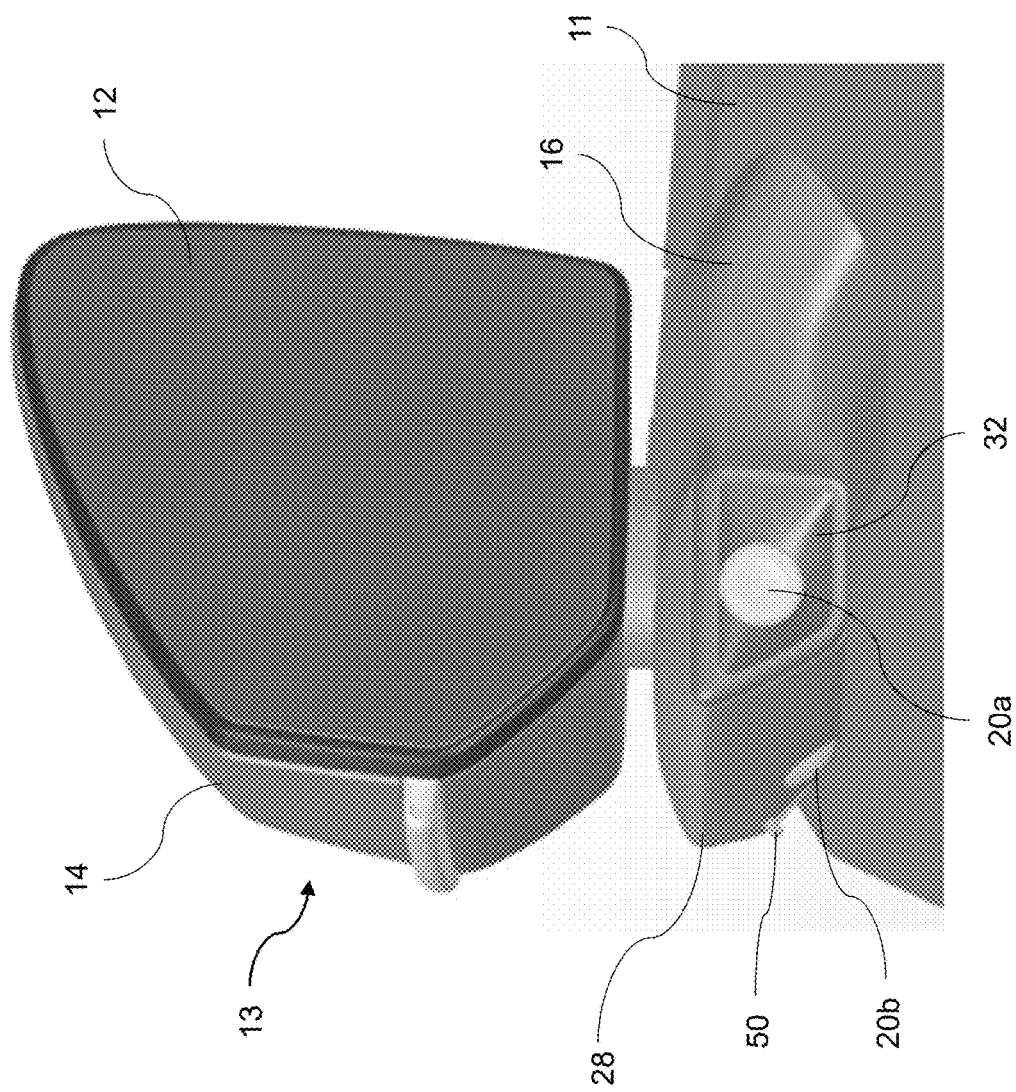
FIG. 2 is a perspective view of the exterior rearview mirror assembly.
Figure 3:
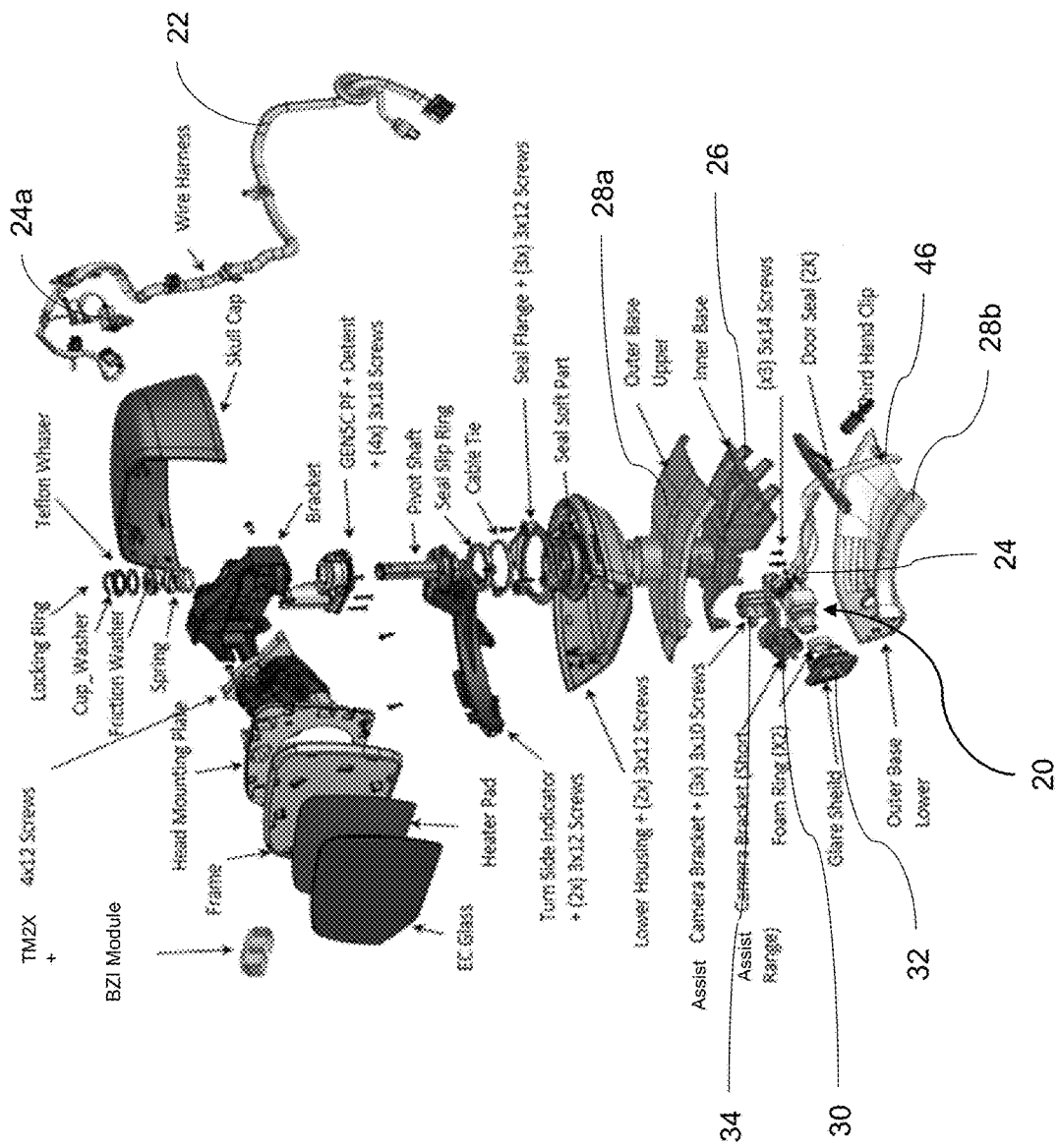
FIG. 3 is an exploded view of the exterior rearview mirror assembly, showing two cameras disposed at the mounting arm of the exterior rearview mirror assembly.

As shown in FIGS. 2 and 3, the mirror reflective element 12 may be fixed relative to the mirror casing 14, such that, in order to adjust the rearward field of view provided to the driver by the mirror reflective element 12, the mirror head 13 (including the mirror reflective element and the mirror casing) is moved relative to the mounting arm 16. For example, an electrically operable actuator may be disposed within the mirror casing 14 and electrically operable (such as in response to a user input) to move the mirror head relative to the mounting arm 16 to adjust an angle and/or position of the mirror reflective element 12 relative to the side of the vehicle to adjust the rearward field of view provided to the driver. Further, the actuator may be operable to move the mirror head between an extended or use position, where the mirror head is extended from the side of the vehicle to provide the rearward field of view, and a folded or park position, where the mirror head is pivoted inward toward the side of the vehicle. The actuator may comprise a detent mechanism, such as to provide a breakaway mirror that may be manually moved between the extended position and the folded position, and optionally to a forward fold position, where the mirror head is manually moved beyond the extended position, such as upon collision with an object. The mirror assembly may utilize aspects of the mirror assemblies described in U.S. Publication Nos. US-2021-0331625; US-2021-0316664; US-2021-0213880; US-2020-0353867 and/or US-2020-0223364, and/or U.S. Pat. Nos. 11,325,535; 10,099,618; 9,827,913; 9,487,142; 9,346,403 and/or 8,915,601, which are all hereby incorporated herein by reference in their entireties.

The mirror assembly 10 accommodates one or more vehicle cameras 20 having any suitable field of view, such as a first or rearward viewing vehicle camera 20a and a second or sideward and downward viewing vehicle camera 20b. In the illustrated example, the first vehicle camera 20a, when the mirror assembly 10 is mounted at the side of the vehicle, has a field of view that is at least rearward and along the side of the vehicle at which the mirror assembly is mounted. The second vehicle camera 20*b* has a field of view that is at least downward and sideward away from the side of the vehicle at which the mirror assembly is mounted. For example, the one or more vehicle cameras 20 may capture image data for a surround view system (SVS) of the vehicle.

Because the mirror head 13 may move relative to the fixed mounting arm 16 and the side of the vehicle 11 to adjust the field of view provided to the driver by the mirror reflective element 12, the one or more cameras 20 are disposed at the base or mounting arm 16 of the mirror assembly 10. The first vehicle camera 20*a* and the second vehicle camera 20*b* are electrically connected to a wire harness 22 that provides electrical power from a power source of the vehicle to the first and second vehicle cameras 20*a*, 20*b* and that communicates signals between the respective cameras and a control or electronic control unit (ECU) of the vehicle, such as to communicate or provide image data captured by the cameras to the ECU or to communicate or provide control signals from the ECU to the respective cameras.

As shown in FIG. 3, the wire harness 22 is routed from the vehicle 11 and passes through the base portion 16 to the mirror head 12, such as to electrically power one or more electronic devices or electronic accessories at the mirror head (e.g., a heater pad of the mirror reflective element, a light source for a blind zone indicator or turn signal, the powerfold actuator, and the like). Respective cables or wires 24 extend from respective electrical connectors at the cameras 20 to electrically connect to the wire harness 22. For example, the cables 24 may electrically connect to the wire harness 22 at the mounting base 16 or the cables 24 may be fed or routed through the base 16 to connect to the wire harness 22 exterior the mirror assembly (e.g., at an interior portion of the vehicle body at the side of the vehicle at which the mirror assembly is mounted).

Figure 4:
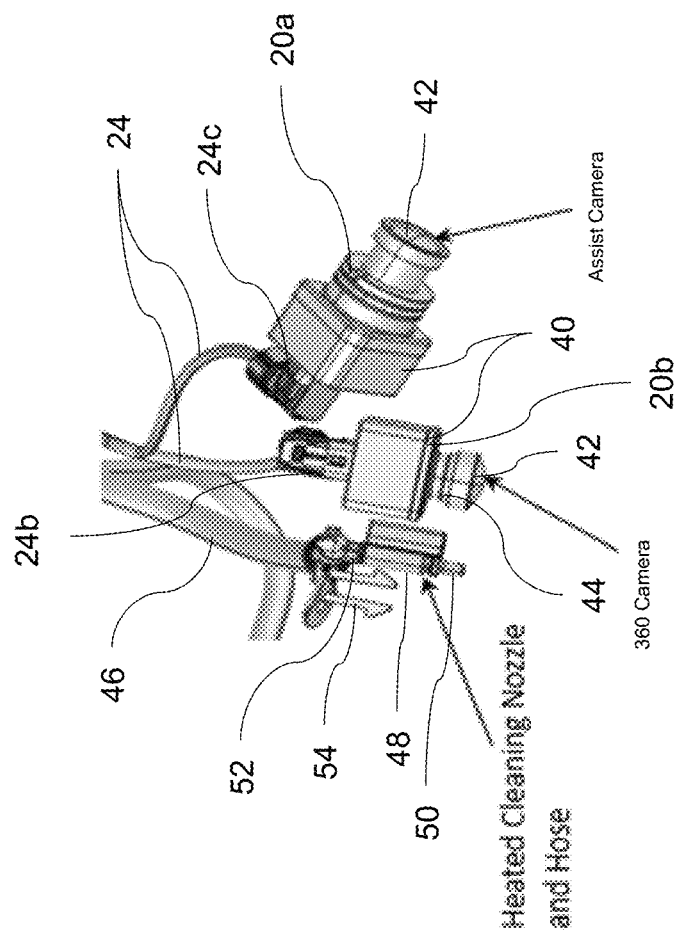
FIG. 4 is a perspective view of the cameras configured to be disposed at the mounting arm of the exterior rearview mirror assembly.
Figure 5:
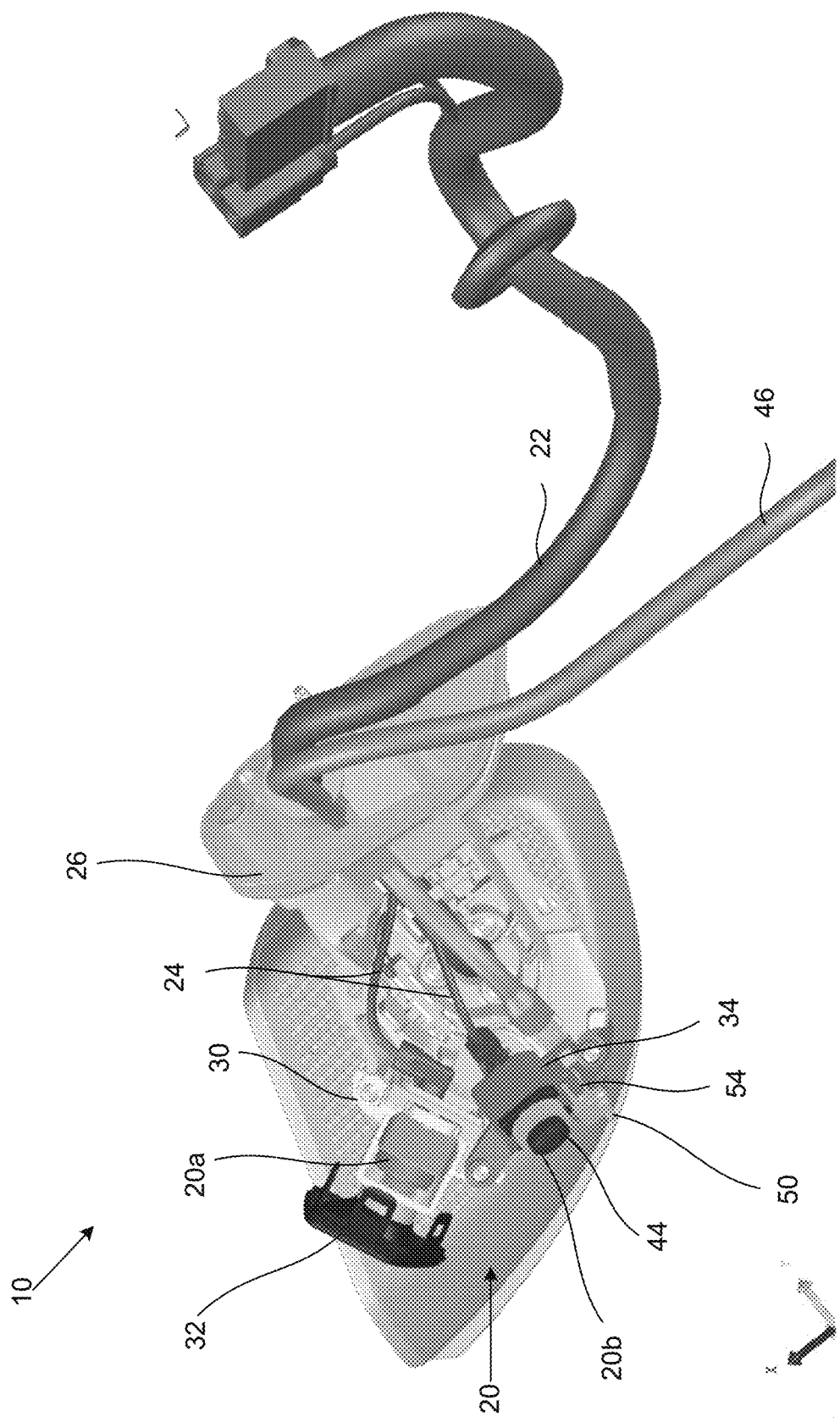
FIGS. 5 and 6 are perspective views of the mounting arm of the exterior rearview mirror assembly with a housing of the mounting arm removed to show the cameras.
Figure 6:
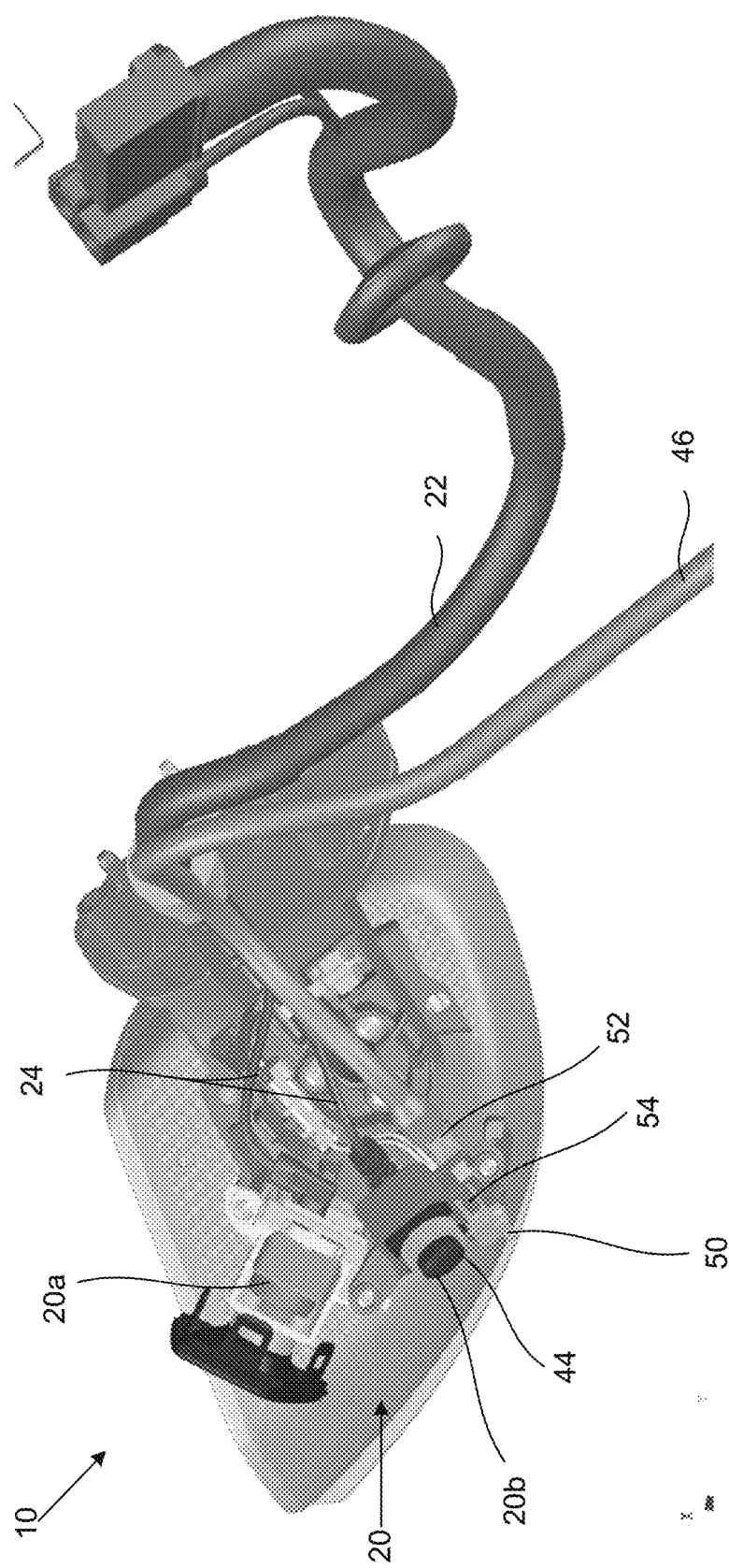

In other words, the wire harness 22 includes a plurality of individual wires that terminate at respective electrical connectors. Each respective electrical connector electrically connects to a respective one of the one or more electronic devices at the mirror head or a respective one of the cameras 20 disposed at the mirror assembly 10 to provide electrical power from a power source of the vehicle. For example, and as shown in FIGS. 3 and 4, a first electrical connector 24*a* of the wire harness may connect to the electronic accessory at the mirror head, a second electrical connector 24*b* may connect to the first vehicle camera 20*a*, and a third electrical connector 24*c* may connect to the second vehicle camera 20*b*. An opposite end of the wire harness includes one or more electrical connectors for electrically connecting to a vehicle wire harness when the exterior rearview mirror assembly is mounted at the side of the vehicle.

The cameras 20 disposed at the mirror assembly 10 may be integrated as part of one or more vision systems that includes the control or electronic control unit (ECU), which has electronic circuitry and associated software, with the electronic circuitry including a data processor or image processor that is operable to process image data captured by the vehicle cameras 20. The vision system, via processing at the ECU of captured image data, may detect or determine presence of objects or the like and/or the system may provide video images or video image data or outputs or signals to a display device of the system for displaying video images for viewing by the driver of the vehicle. The ECU receives image data captured by each of the first vehicle camera 20*a* and the second vehicle camera 20*b* and the image data is processed by the data processor or image processor of the ECU. The wire harness 22, via the second connector 24*b* and the third connector 24*c*, may provide electrical power and control signals to the respective cameras 20 and carry captured image data from the respective cameras 20 to the ECU at the vehicle.

The vehicle vision system and/or driver or driving assist system and/or object detection system and/or alert system operates to capture image data exterior of the vehicle and may process the captured image data to display images and to detect objects at or near the vehicle and in the predicted path of the vehicle, such as to assist a driver of the vehicle in maneuvering the vehicle in a forward or rearward direction. The vision system includes an image processor or image processing system that is operable to receive image data from one or more cameras and to provide an output to one or more display devices for displaying video images representative of the captured image data. For example, the vision system may provide a rearview display or a top down or bird's eye or surround view display or the like.

The cameras 20 are supported by an inner base or frame structure 26 of the mounting base 16 and are disposed at or view through respective apertures formed through a housing or cover portion 28 of the base 16. The cover or housing 28 may include a first or upper housing portion 28*a* and a second or lower housing portion 28*b* that join together to house the frame structure 26 of the base 16 and the one or more vehicular cameras 20. When the mirror assembly is attached at the side of the vehicle 11, the frame structure 26 of the mounting base 16 mounts to the side of the vehicle (such as via bolts, screws, or any suitable threaded fastener).

The first vehicle camera 20*a* of the exterior rearview mirror assembly 10 may be oriented at the support arm or base 16 so as to view at least rearward and along the side of the vehicle, whereby image data captured by the first vehicle camera 20*a* is provided to the ECU and processed, such as via machine vision processing, to detect objects or other vehicles sideward and rearward of the vehicle, and/or video images based on the captured image data are generated for display at a video display screen in the vehicle for viewing by the driver of the vehicle while operating the vehicle. The first camera 20*a* thus may capture image data to assist in maneuvering the vehicle and optionally to assist in autonomous driving operations and/or autonomous maneuvers of the vehicle. The first vehicle camera 20*a* may be used in a multi-camera vision system that displays video images when the vehicle is moving in a forward direction, such as by utilizing aspects of the vision systems described in International Publication No. WO 2022/150826, which is hereby incorporated herein by reference in its entirety. Optionally, the rearward view of the first vehicle camera 20*a* may assist for a highway patrol function or system.

The first camera 20*a* may be disposed at a first camera bracket 30 attached at the inner base 26, with a glare light shield 32 attached at the camera 20*a* or bracket 30 to reduce or eliminate glare light from entering the lens during operation of the camera. The first camera bracket 30 may attach at the inner base 26 in any suitable manner, such as via snap attaching, threaded fasteners, and the like. Optionally, the first camera bracket 30 may be integrally formed with the inner base 26.

The second camera may be disposed at a second camera bracket 34 attached at the inner base 26. The second camera bracket 34 may attach at the inner base 26 in any suitable manner, such as via snap attaching, threaded fasteners, and the like. Optionally, the second camera bracket 34 may be integrally formed with the inner base 26. The second vehicle camera 20*b* is oriented at the support arm or base so as to view at least sideward and downward from the side of the vehicle at which the mirror assembly is mounted, whereby image data captured by the second vehicle camera 20b is provided to the ECU. For example, the image data captured by the second vehicle camera 20b may be processed to generate video images for display at a video display screen in the vehicle for viewing by the driver of the vehicle while operating the vehicle. The second camera thus may capture image data to assist in maneuvering the vehicle. For example, the second vehicle camera 20b may be used in a multi-camera vision system that displays top down or surround view or bird's-eye view video images during a reversing or parking maneuver of the vehicle, such as by utilizing aspects of the vision systems described in U.S. Pat. Nos. 10,640,042 and 11,242,008, which are hereby incorporated herein by reference in their entireties.

The first vehicle camera 20a may have a narrower field of view as compared to the second vehicle camera 20b. For example, the field of view of the first vehicle camera 20a may be approximately 100 degrees wide or less than 100 degrees wide or less than 80 degrees wide. The field of view of the second vehicle camera 20b may be wider than the field of view of the first camera, such as, for example, greater than 130 degrees, such as approximately 180 degrees or greater than 180 degrees. The image data captured by the first vehicle camera 20a and the second vehicle camera 20b is communicated to the ECU, whereby video images derived from the captured image data are displayed on the display device for viewing by a driver of the vehicle while maneuvering the vehicle.

Figure 7:
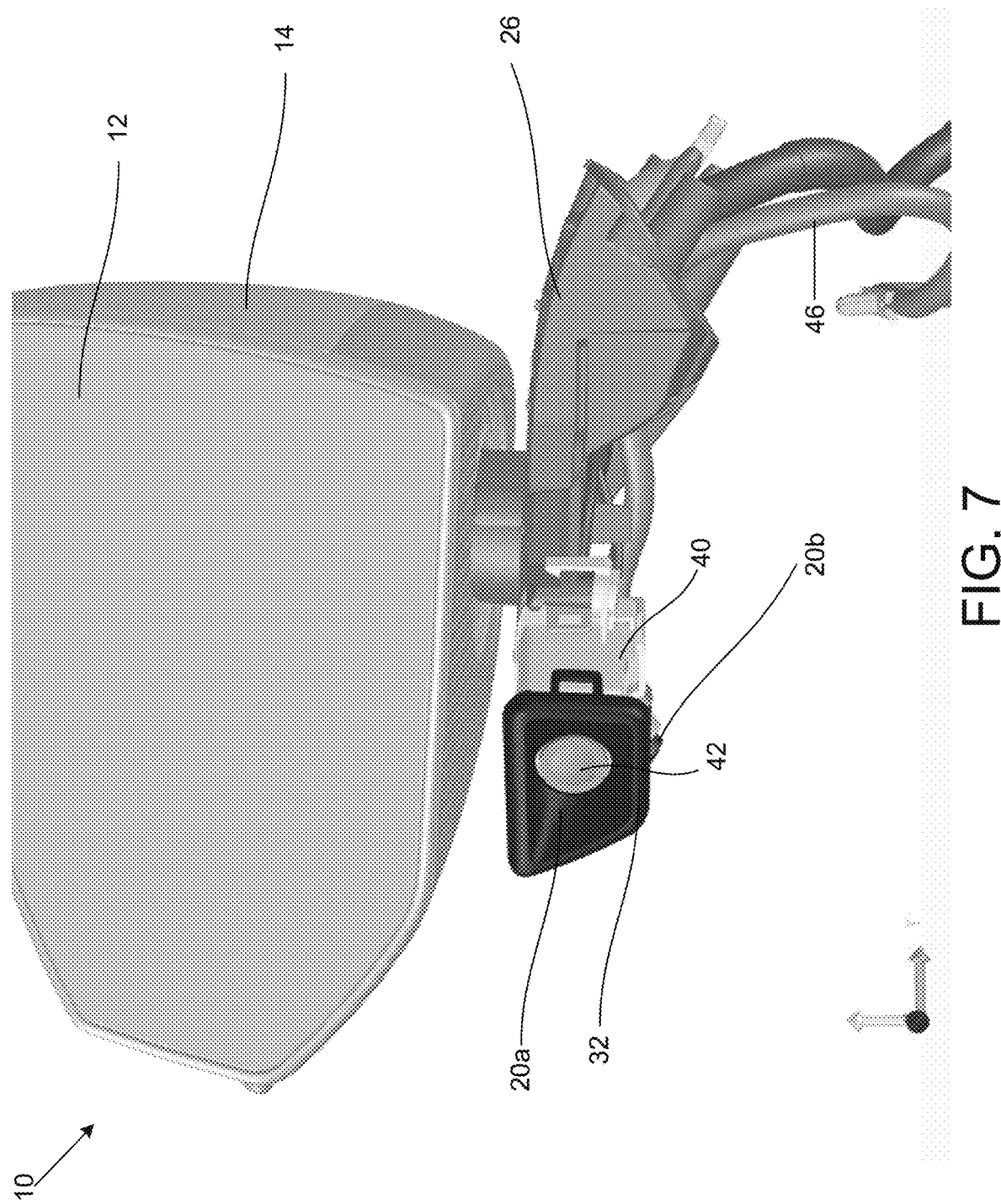
FIGS. 7-9 are perspective views of the exterior rearview mirror assembly, with the housing of the mounting arm removed to show the cameras.
Figure 8:
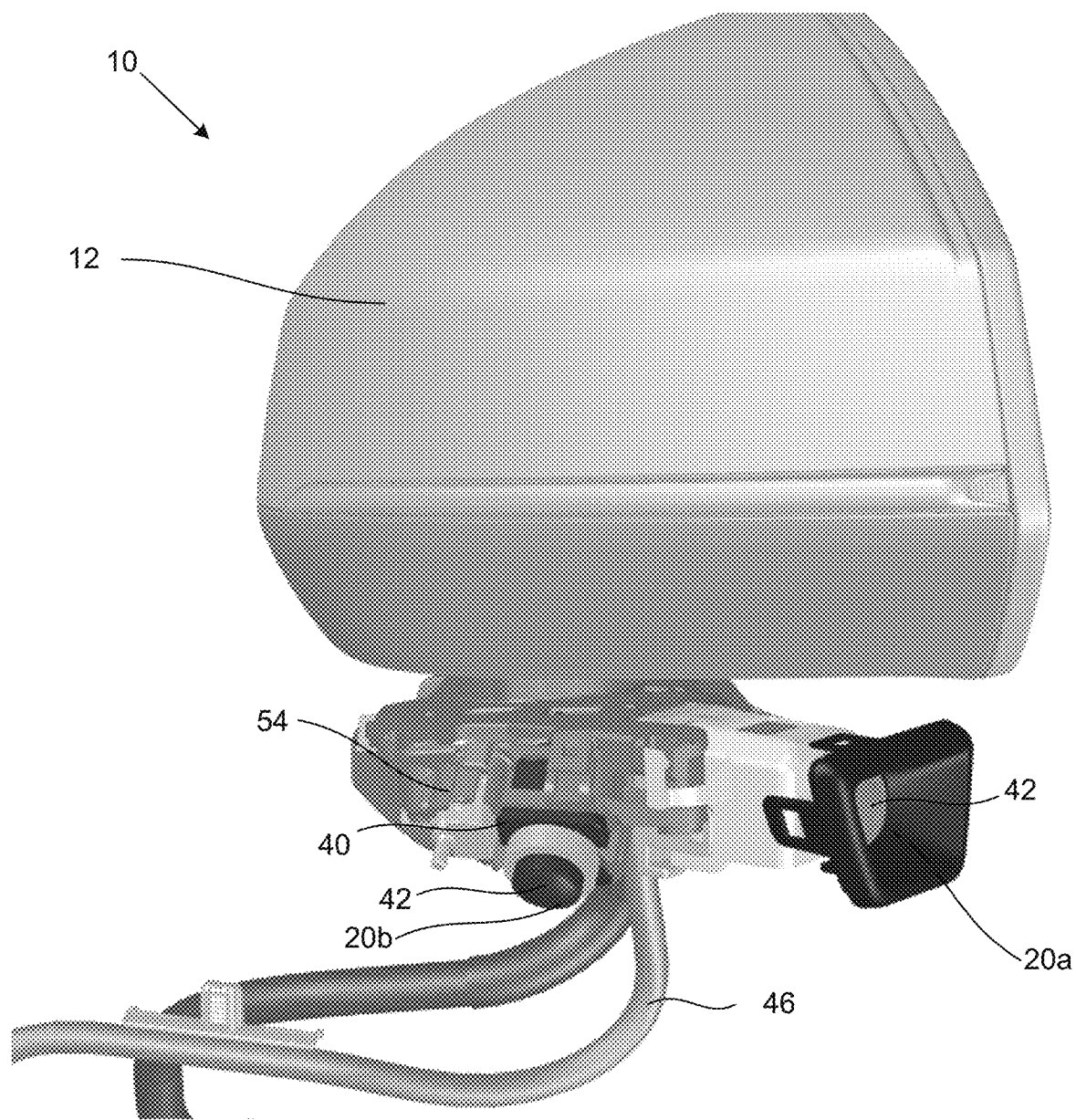
Figure 9:
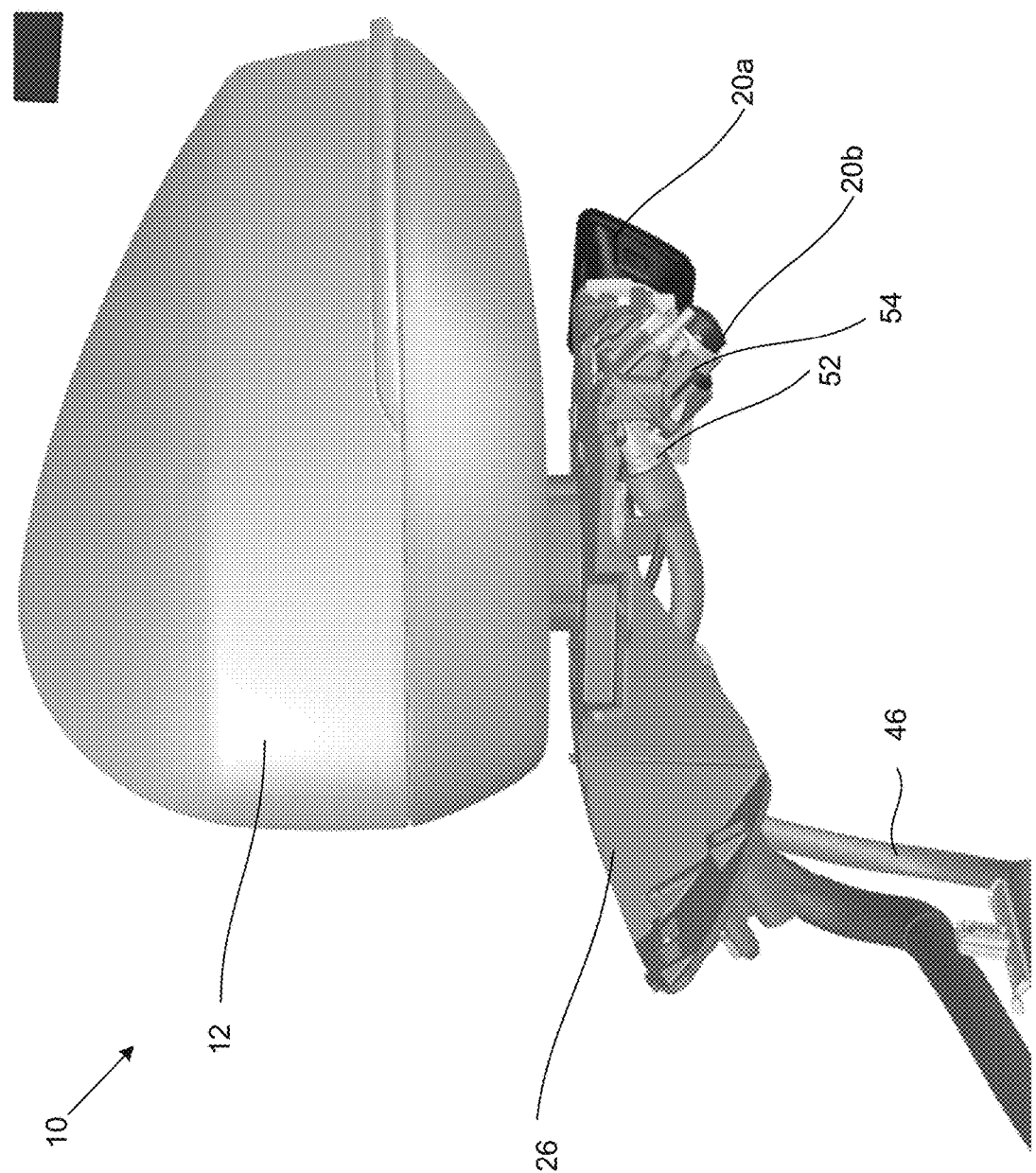

Referring to FIGS. 7-9, the first camera 20a and the second camera 20b each include a housing 40 that accommodates a printed circuit board (PCB) having an imager disposed thereat and one or more lens or optic elements 42 that are accommodated by the housing and optically aligned with the imager. The lens 42 are oriented such that the cameras view exterior of the vehicle. For example, the lens 42 may be exposed at the exterior of the mirror head. Thus, the cameras are susceptible to dirt or debris collecting at the lens of the camera. Also, because the cameras are disposed at the vehicle exterior, the cameras may be exposed to cold temperatures and temperature and humidity fluctuations, whereby moisture and/or ice or snow may form at the lens. Thus, one or both of the cameras may include a lens washer attachment or system, such as by utilizing aspects of the lens washers described in U.S. Pat. No. 10,894,275 and U.S. Publication Nos. US-2016-0272163 and/or US-2016-0264064, which are hereby incorporated herein by reference in their entireties.

For example, and such as shown in FIGS. 2-9, the second vehicle camera 20b includes the housing 40 and a lens barrel 44 accommodated by the housing 40 that supports the lens 42. A washer attachment 48 is configured to attach at or near the second camera 20b, such as at the second camera bracket 34 or at attachment structure of the camera, to position a nozzle or outlet end 50 of the washer 48 at or near the camera lens 42. For example, the washer 48 may snap attach at the lens barrel 44. The washer attachment 48 is configured to provide a fluid passageway or channel through and along which pressurized washer fluid flows (such as pressurized washer fluid supplied from a pump and reservoir at the vehicle) to deliver pressurized washer fluid (e.g., water or cleaning solution) at the outer surface of the camera lens 42. As shown in FIG. 2, the nozzle 50 may be disposed at the exterior surface of the mirror head so that pressurized washer fluid may be directed from the nozzle end and toward the outer lens of the camera and thus washer fluid and debris may flow off of the camera lens and mirror head at the exterior of the vehicle.

The washer attachment 48 includes a flow channel or passageway extending between a hose connector end 52 and the nozzle end 50. The washer attachment 48 may also include a clip or attachment element 54 that is configured to snap attach at the second camera bracket 34 to retain the washer attachment 48 at the vehicle camera 20b. A hose or conduit 46 is coupled to the hose connector end 52 and delivers the pressurized fluid from the reservoir and/or pump at the vehicle and to the washer attachment 48. The hose 46 extends from the washer attachment and is routed within the base or mounting arm 16 to an interior portion of the vehicle body panel. Furthermore, the washer attachment 48 may comprise a heater (such as disposed at or near the nozzle 50) that is electrically operable to heat the pressurized fluid delivered via the nozzle 50. For example, the heater of the washer attachment 48 may be operated to heat the fluid when an external temperature at the vehicle is below a threshold temperature (e.g., 32 degrees Fahrenheit) to preclude fogging of the camera lens and to improve the ability of the washer to remove ice from the camera.

Thus, and such as shown in FIG. 3, a wire harness connector 22 extends from the mirror head 13 and along the base 16 of the mirror assembly for electrical connection to the vehicle wire harness when the mirror assembly is mounted at the side of the vehicle. Within the mounting base 16, the wire harness 22 electrically connects to respective cables 24 and electrical connectors electrically connected to the respective cameras 20a, 20b to electrically power the cameras and to communicate signals between the cameras and the vehicle ECU, such as to provide control signals to the cameras and to provide image data captured by the cameras to the ECU. Another wire of the wire harness may terminate at an electrical connector that electrically connects to the electronic device or accessory at the mirror head. The hose or fluid conduit 46 extends from the vehicle and along the mounting base of the mirror assembly for connection between the washer attachment 48 and a fluid supply of the vehicle. The hose 46 provides pressurized fluid communication from the fluid supply of the vehicle to the washer nozzle for cleaning and/or de-icing one or more of the cameras at the mirror assembly. Thus, the exterior rearview mirror assembly may be provided as a single mirror assembly or unit that is mounted at the side of the vehicle and electrical connection is made to the vehicle wire harness and fluid connection is made to the fluid source when the mirror assembly is mounted at the side of the vehicle.

In other words, the exterior mirror assembly 10 includes one or more (such as two or more) cameras 20 disposed at the base or mounting arm 16. The first camera 20a views at least rearward and along the side of the vehicle and captures image data as the vehicle travels along the road. For example, the first camera 20a may capture image data that is processed at the vehicle ECU for a highway patrol system, for an advanced driver assist system (ADAS) that provides at least partially autonomous control of the vehicle, or for a multi-camera vision system configured to display video images for viewing by the driver of the vehicle. The second camera 20b views at least downward and sideward from the side of the vehicle at which the mirror assembly is mounted and captures image data as the vehicle travels along the road. For example, the second camera 20b may capture image data that is processed at the vehicle ECU for a SVS or bird's eye view display that displays overhead or 360 degree surround view video images to the driver of the vehicle. The cameras are powered and controlled via respective cables 24 that are fed or routed through the support arm 16 and that connect to the vehicle wire harness 22, such as within the vehicle support arm 16 or at an interior portion of the vehicle body. Furthermore, the washer 48 is provided to clean at least the downward viewing camera 20b and the washer tube 46 is routed through the support arm 16 to the vehicle body to deliver pressurized washer fluid to the nozzle 50 of the washer.

Optionally, the mirror head accommodates one or more electronic devices or accessories that electrically connects to the vehicle power source via the wire harness that passes along the mounting base of the mirror assembly. For example, the electronic accessory includes a mirror actuator that is electrically operated to move the mirror head relative to the mounting base (such as between a folded or non-use position and an extended or use position). Optionally, the electronic accessory includes a heating element that is electrically operated to heat the mirror reflective element, such as to provide a defogging or deicing feature of the mirror assembly.

Optionally, the electronic accessory includes a light source disposed at the mirror head and that is electrically operable to emit light that is viewable from exterior the mirror head. For example, the light source may emit light that is viewable through the mirror reflective element, such as for a blind spot indicator. Optionally, the light source may be operated to provide a turn signal indicator at the mirror head. Optionally, the light source may be operated to emit light at least downward and toward a ground surface at or near the side of the vehicle at which the mirror assembly is mounted, such as to provide ground illumination or to illuminate or project an icon or logo at the ground at the side of the vehicle. Optionally, the light source may be operated to emit light at least sideward from the side of the vehicle at which the mirror head is mounted, such as to provide a floodlight (e.g., wide field of illumination, such as greater than or equal to 45 degrees or more) or spotlight (e.g., narrow field of illumination, such as less than 45 degrees) emanating from the vehicle. The light source or illumination module may utilize aspects of the light sources and modules described in U.S. Pat. Nos. 10,576,896; 8,764,256; 8,242,896; 7,994,371; 7,626,749; 7,581,859; 7,492,281, which are hereby incorporated herein by reference in their entireties.

Optionally, one or both of the cameras, such as the rearward viewing camera, may capture image data for a camera monitoring system (CMS) of the vehicle. The integrated vehicle system may incorporate multiple inputs, such as from an inward viewing or driver monitoring camera and from a forward or outward viewing camera, as well as from a rearward viewing camera and sideward viewing cameras of the CMS, to provide the driver with unique collision mitigation capabilities based on full vehicle environment and driver awareness state. The image processing and detections and determinations are performed at the ECU, which may be at the vehicle, such as at an interior rearview mirror assembly of the vehicle, depending on available space and electrical connections for the particular vehicle application. The CMS cameras and system may utilize aspects of the systems described in U.S. Pat. No. 11,242,008 and/or U.S. Publication Nos. US-2021-0162926; US-2021-0155167; US-2018-0134217 and/or US-2014-0285666, and/or International Publication No. WO 2022/150826, which are all hereby incorporated herein by reference in their entireties.

The ECU may receive image data captured by a plurality of cameras of the vehicle, such as by a plurality of surround view system (SVS) cameras (including the downward viewing camera) and a plurality of camera monitoring system (CMS) cameras (including a rearward viewing camera) and optionally one or more interior driver monitoring system (DMS) cameras. The ECU may comprise a central or single ECU that processes image data captured by the cameras for a plurality of driving assist functions and may provide display of different video images to a video display screen in the vehicle (such as at an interior rearview mirror assembly or at a central console or the like) for viewing by a driver of the vehicle. The system may utilize aspects of the systems described in U.S. Pat. Nos. 11,242,008; 10,442,360 and/or 10,046,706, and/or U.S. Publication Nos. US-2021-0155167 and/or US-2019-0118717, and/or International Publication No. WO 2022/150826, which are all hereby incorporated herein by reference in their entireties.

Optionally, the reflective element of the mirror assembly 10 is fixed relative the mirror casing, such that the entire mirror head (including the mirror casing and the mirror reflective element) moves to adjust the rearward view of the reflective element. For example, an inner casing or housing at least partially encases or encompasses a rear of the reflective element and is received in the mirror casing and moves with the reflective element. The reflective element moves together and in tandem with the mirror casing when it is moved relative to the support arm at the side of the vehicle (such as for powerfold and/or breakaway mirror applications). The mirror assembly may utilize aspects of the mirror assemblies described in U.S. Pat. Nos. 10,099,618; 9,827,913 and/or 9,346,403, which are hereby incorporated herein by reference in their entireties.

Optionally, the exterior mirror element of the mirror assembly may include heater pad or film or element at a rear surface of the mirror reflective element. The heater pad or element at the rear surface of the glass substrate may comprise a mirror defrost/demisting heater and may provide an anti-fogging of de-fogging feature to the exterior mirror assembly, and may utilize aspects of the heater elements or pads described in U.S. Pat. Nos. 9,481,304; 8,058,977; 7,400,435; 5,808,777; 5,610,756 and/or 5,446,576, and/or U.S. Pat. Publication No. 2008/0011733, which are hereby incorporated herein by reference in their entireties. The heater element may include electrical contacts that extend rearward therefrom and through an aperture of attaching portion of back plate for electrical connection to the wire harness or connector of the mirror assembly, or the back plate and/or heater pad may include suitable electrical connectors and connections incorporated therein (such as by utilizing aspects of the mirror assembly described in U.S. Pat. No. 7,400,435, which is hereby incorporated herein by reference in its entirety) for electrically connecting the heater pad (or other suitable electrical connectors may be utilized, such as electrical leads or wire harnesses or pigtails or other separate connectors or cables or the like). Optionally, the heater pad may comprise a screen printed heater pad. For example, the heater pad can be printed on the back of the mirror reflective element (such as at the fourth or rear surface of the rear substrate). Such coatings may be printed and then cured at around 120 degrees C. or lower, making this process compatible with already formed laminate type EC mirror elements, such as those described in U.S. Pat. No. 5,724,187, which is hereby incorporated herein by reference in its entirety. This would make it compatible with EC mirrors.

The mirror assembly may comprise any suitable construction, such as, for example, a mirror assembly with the reflective element being nested in the mirror casing and with the mirror casing having a curved or beveled perimeter edge around the reflective element and with no overlap onto the front surface of the reflective element (such as by utilizing aspects of the mirror assemblies described in U.S. Pat. Nos. 7,255,451; 7,289,037; 7,360,932; 8,049,640; 8,277,059 and/or 8,529,108, or such as a mirror assembly having a rear substrate of an electro-optic or electrochromic reflective element nested in the mirror casing, and with the front substrate having curved or beveled perimeter edges, or such as a mirror assembly having a single planar (for driver side mirror applications) or curved (for passenger side mirror applications) glass substrate reflective element that is disposed at an outer perimeter edge of the mirror casing and with the glass substrate having curved or beveled perimeter edges, such as described in U.S. Pat. Nos. 10,099,618; 9,827,913; 9,598,016; 9,346,403; 9,174,578; 8,915,601; 8,730,553 and/or 8,508,831, and/or U.S. Des. Pat. Nos. D633,423; D633,019; D638,761 and/or D647,017, which are hereby incorporated herein by reference in their entireties (and with mirrors of such construction are commercially available from the assignee of this application under the trade name INFINITY™ mirror).

Optionally, the mirror assembly may include a blind spot indicator and/or a turn signal indicator, such as an indicator or indicators of the types described in U.S. Pat. Nos. 8,242,896; 7,492,281; 6,198,409; 5,929,786; and 5,786,772, which are hereby incorporated herein by reference in their entireties. The signal indicator or indication module may include or utilize aspects of various light modules or systems or devices, such as the types described in U.S. Pat. Nos. 8,764,256; 7,626,749; 7,581,859; 6,227,689; 6,582,109; 5,371,659; 5,497,306; 5,669,699; 5,823,654; 6,176,602 and/or 6,276,821, and/or U.S. Publication No. US-2013-0242586, which are all hereby incorporated herein by reference in their entireties.

Such an indicator or indicators may function as a lane change assist (LCA) indicator or indicators and/or a blind spot indicator or indicators. Such blind spot indicators are typically activated when an object is detected (via a side object or blind spot detection system or the like such as described in U.S. Pat. Nos. 7,492,281; 7,038,577; 6,882,287; 6,198,409; 5,929,786; 5,786,772 and/or 7,720,580, which are hereby incorporated herein by reference in their entireties) at the side and/or rear of the vehicle (at the blind spot) and when the turn signal is also activated, so as to provide an alert to the driver of the host vehicle that there is an object or vehicle in the lane next to the host vehicle at a time when the driver of the host vehicle intends to move over into the adjacent lane. Optionally, and alternately, the indicator or indicators may function as a lane change assist indicator or indicators, where the host vehicle may be detected to be moving into an adjacent lane without the turn signal being activated, and an object or vehicle may be detected at the adjacent lane, whereby the LCA indicator or indicators may be activated to provide an alert to the driver of the lane change to assist the driver in avoiding unintentional lane changes and/or lane changes when a vehicle or object is detected in the adjacent lane.

The blind spot indicators thus may be operable to provide an indication to the driver of the host vehicle that an object or other vehicle has been detected in the lane or area adjacent to the side of the host vehicle. The blind spot indicator may be operable in association with a blind spot detection system, which may include an imaging sensor or sensors, or an ultrasonic sensor or sensors, or a sonar sensor or sensors or the like. For example, the blind spot detection system may utilize aspects of the blind spot detection and/or imaging systems described in U.S. Pat. Nos. 7,038,577; 6,882,287; 6,198,409; 5,929,786; 5,786,772; 7,881,496 and/or 7,720,580, and/or of the reverse or backup aid systems, such as the rearwardly directed vehicle vision systems described in U.S. Pat. Nos. 5,550,677; 5,760,962; 5,670,935; 6,201,642; 6,396,397; 6,498,620; 6,717,610 6,757,109 and/or 7,005,974, and/or of the automatic headlamp controls described in U.S. Pat. Nos. 5,796,094; 5,715,093; and/or 7,526,103, and/or of the rain sensors described in U.S. Pat. Nos. 6,250,148 and 6,341,523, and/or of other imaging systems, such as the types described in U.S. Pat. Nos. 6,353,392 and 6,313,454, which may utilize various imaging sensors or imaging array sensors or cameras or the like, such as a CMOS imaging array sensor, a CCD sensor or other sensors or the like, such as the types disclosed in commonly assigned, U.S. Pat. Nos. 8,982,273; 6,097,023; 5,796,094; 5,760,962 and/or 5,550,677, with all of the above referenced U.S. patents being hereby incorporated herein by reference in their entireties.

The mirror assembly may comprise an electro-optic or electrochromic mirror assembly that includes an electro-optic or electrochromic reflective element. The perimeter edges of the reflective element may be encased or encompassed by the perimeter element or portion of the bezel portion to conceal and contain and envelop the perimeter edges of the substrates and the perimeter seal disposed therebetween. The electrochromic mirror element of the electrochromic mirror assembly may utilize the principles disclosed in commonly assigned U.S. Pat. Nos. 8,503,061; 7,274,501; 7,255,451; 7,195,381; 7,184,190; 6,690,268; 5,140,455; 5,151,816; 6,178,034; 6,154,306; 6,002,511; 5,567,360; 5,525,264; 5,610,756; 5,406,414; 5,253,109; 5,076,673; 5,073,012; 5,115,346; 5,724,187; 5,668,663; 5,910,854; 5,142,407 and/or 4,712,879, which are hereby incorporated herein by reference in their entireties.

Changes and modifications in the specifically described embodiments may be carried out without departing from the principles of the present disclosure, which is intended to be limited only by the scope of the appended claims as interpreted according to the principles of patent law.

The invention claimed is:

1. A vehicular exterior rearview mirror assembly, the vehicular exterior rearview mirror assembly comprising:

a mirror head accommodating a mirror reflective element;

a mounting base configured for attachment at a side of a vehicle, wherein the mirror head is mounted at and is adjustable about the mounting base;

wherein, with the mounting base attached at the side of the vehicle, the mirror head is movable relative to the mounting base between at least (i) an extended position where the mirror head is extended outward from the side of the vehicle so that the mirror reflective element is positioned to provide a rearward view at the side of the vehicle to a driver of the vehicle and (ii) a folded position where the mirror head is folded inward from the extended position toward the side of the vehicle;

an actuator, wherein, with the mounting base attached at the side of the vehicle, the actuator is electrically operable to move the mirror head relative to the mounting base;

wherein, with the mirror head in the extended position to provide the rearward view to the driver of the vehicle, and when the actuator is electrically operating to adjust the mirror head relative to the mounting base, the mirror reflective element moves in tandem with the mirror head relative to the mounting base to adjust the rearward view provided to the driver of the vehicle;

a plurality of cameras disposed at the mounting base, wherein the plurality of cameras, with the mounting base attached at the side of the vehicle, are operable to capture image data;

wherein the mounting base comprises (i) a frame portion that attaches at the side of the vehicle and (ii) a housing that is attached to the frame portion and that accommodates the plurality of cameras and the frame portion at an interior portion of the housing;

wherein individual cameras of the plurality of cameras are attached to the frame portion;

wherein the housing comprises a first housing portion and a second housing portion that join together to encase the frame portion and the plurality of cameras at the interior portion of the housing;

wherein the plurality of cameras comprises (i) a rearward viewing camera that, with the mounting base attached at the side of the vehicle, views at least rearward of the vehicle and (ii) a downward viewing camera that, with the mounting base attached at the side of the vehicle, views at least downward;

wherein the mirror head accommodates an electronic accessory of the vehicular exterior rearview mirror assembly;

a wire harness passing through the mounting base to the mirror head, wherein the wire harness has a plurality of individual wires, and wherein wires of the plurality of individual wires terminate at respective first, second and third electrical connectors;

wherein, with the mounting base attached at the side of the vehicle, the electronic accessory at the mirror head electrically connects to the first electrical connector of the wire harness;

wherein the rearward viewing camera, with the mounting base attached at the side of the vehicle, electrically connects to the second electrical connector of the wire harness;

wherein the downward viewing camera, with the mounting base attached at the side of the vehicle, electrically connects to the third electrical connector of the wire harness;

wherein, with the mounting base attached at the side of the vehicle, and with the electronic accessory electrically connected to the first electrical connector of the wire harness, the electronic accessory is electronically connected to an electrical power source of the vehicle for delivering electrical power from the electrical power source to the electronic accessory;

wherein, with the mounting base attached at the side of the vehicle, and with the rearward viewing camera electrically connected to the second electrical connector of the wire harness, the rearward viewing camera (i) receives electrical power from the electrical power source via the wire harness and (ii) provides image data captured by the respective camera of the plurality of cameras to an electronic control unit (ECU) disposed at the vehicle; and wherein, with the mounting base attached at the side of the vehicle, and with the downward viewing camera electrically connected to the third electrical connector of the wire harness, the downward viewing camera (i) receives electrical power from the electrical power source via the wire harness and (ii) provides image data captured by the respective camera of the plurality of cameras to the ECU.

2. The vehicular exterior rearview mirror assembly of claim 1, wherein the wire harness passes along the frame portion of the mounting base and within the interior portion of the housing.

3. The vehicular exterior rearview mirror assembly of claim 1, wherein the plurality of cameras are mounted at a bracket attached to the frame portion, and wherein each camera of the plurality of cameras is disposed at a respective aperture formed through the housing.

4. The vehicular exterior rearview mirror assembly of claim 3, wherein each camera of the plurality of cameras is mounted at a respective bracket attached to the frame portion.

5. The vehicular exterior rearview mirror assembly of claim 1, comprising a lens washer disposed at the mounting base, wherein the lens washer comprises a nozzle that, with the mounting base attached at the side of the vehicle, is in fluid communication with a pressurized fluid source of the vehicle, and wherein the lens washer is operable to direct pressurized fluid from the nozzle toward a lens of one or more cameras of the plurality of cameras.

6. The vehicular exterior rearview mirror assembly of claim 5, wherein, with the mounting base attached at the side of the vehicle, a fluid conduit that is in fluid communication with the pressurized fluid source passes along the mounting base and fluidly connects to the nozzle of the lens washer.

7. The vehicular exterior rearview mirror assembly of claim 5, wherein the lens washer directs pressurized fluid from the nozzle toward the lens of the downward viewing camera.

8. The vehicular exterior rearview mirror assembly of claim 1, wherein the ECU comprises electronic circuitry and associated software, and wherein the electronic circuitry comprises an image processor configured to process image data captured by each camera of the plurality of cameras, and wherein image data captured by the rearward viewing camera is processed at the ECU for a driving assist system of the vehicle.

9. The vehicular exterior rearview mirror assembly of claim 1, wherein, with the mounting base attached at the side of the vehicle, the rearward viewing camera views at a first visual angle relative to the side of the vehicle and the downward viewing camera views at a second visual angle relative to the side of the vehicle, and wherein the first visual angle is different from the second visual angle.

10. The vehicular exterior rearview mirror assembly of claim 9, wherein the first visual angle is less than or equal to 100 degrees, and wherein the second visual angle is greater than or equal to 180 degrees.

11. The vehicular exterior rearview mirror assembly of claim 1, wherein at least one camera of the plurality of cameras comprises a lens element that is exposed at an exterior surface of the mounting base, and wherein the exterior surface of the mounting base comprises a glare light shield that at least partially circumscribes the lens element of the at least one camera.

12. The vehicular exterior rearview mirror assembly of claim 11, wherein the at least one camera comprises the rearward viewing camera.

13. The vehicular exterior rearview mirror assembly of claim 1, wherein the electronic accessory comprises the actuator.

14. The vehicular exterior rearview mirror assembly of claim 1, wherein the electronic accessory comprises a heating element that is operable to heat the mirror reflective element.

15. The vehicular exterior rearview mirror assembly of claim 1, wherein the electronic accessory comprises a light source that, when electrically operated to emit light, emits light that is viewable exterior the mirror head.

16. The vehicular exterior rearview mirror assembly of claim 15, wherein the light source, when electrically operated to emit light, emits light at least downward and along the side of the vehicle to at least partially illuminate a ground surface along the side of the vehicle.

17. The vehicular exterior rearview mirror assembly of claim 16, wherein the light source illuminates an icon or logo at the ground surface along the side of the vehicle.

18. The vehicular exterior rearview mirror assembly of claim 15, wherein the light source, when electrically operated to emit light, emits light at least sideward from the side of the vehicle to provide a floodlight or spotlight of the vehicle.

19. The vehicular exterior rearview mirror assembly of claim 15, wherein the light source, when electrically operated to emit light, provides a turn signal indicator of the vehicle.

20. The vehicular exterior rearview mirror assembly of claim 15, wherein the light source, when electrically operated to emit light, provides a blind zone indicator of the vehicle.

21. A vehicular exterior rearview mirror assembly, the vehicular exterior rearview mirror assembly comprising:
a mirror head accommodating a mirror reflective element;
a mounting base configured for attachment at a side of a vehicle, wherein the mirror head is mounted at and is adjustable about the mounting base;
wherein, with the mounting base attached at the side of the vehicle, the mirror head is movable relative to the mounting base between at least (i) an extended position where the mirror head is extended outward from the side of the vehicle so that the mirror reflective element is positioned to provide a rearward view at the side of the vehicle to a driver of the vehicle and (ii) a folded position where the mirror head is folded inward from the extended position toward the side of the vehicle;
an actuator, wherein, with the mounting base attached at the side of the vehicle, the actuator is electrically operable to move the mirror head relative to the mounting base;
wherein, with the mirror head in the extended position to provide the rearward view to the driver of the vehicle, and when the actuator is electrically operating to adjust the mirror head relative to the mounting base, the mirror reflective element moves in tandem with the mirror head relative to the mounting base to adjust the rearward view provided to the driver of the vehicle;
a plurality of cameras disposed at the mounting base, wherein the plurality of cameras, with the mounting base attached at the side of the vehicle, are operable to capture image data;
wherein the plurality of cameras comprises (i) a rearward viewing camera that, with the mounting base attached at the side of the vehicle, views at least rearward of the vehicle and (ii) a downward viewing camera that, with the mounting base attached at the side of the vehicle, views at least downward;
wherein the mounting base comprises (i) a frame portion that attaches at the side of the vehicle and (ii) a housing that is attached to the frame portion and that accommodates the plurality of cameras and the frame portion at an interior portion of the housing;
wherein individual cameras of the plurality of cameras are attached to the frame portion;
wherein the housing comprises a first housing portion and a second housing portion that join together to encase the frame portion and the plurality of cameras at the interior portion of the housing;
wherein the rearward viewing camera comprises a lens element that is exposed at an exterior surface of the housing, and wherein the exterior surface of the housing comprises a glare light shield that at least partially circumscribes the lens element of the rearward viewing camera;
wherein the mirror head accommodates an electronic accessory of the vehicular exterior rearview mirror assembly;
a wire harness passing through the mounting base to the mirror head, wherein the wire harness has a plurality of individual wires, and wherein wires of the plurality of individual wires terminate at respective first, second and third electrical connectors;
wherein, with the mounting base attached at the side of the vehicle, the electronic accessory at the mirror head electrically connects to the first electrical connector of the wire harness;
wherein the rearward viewing camera, with the mounting base attached at the side of the vehicle, electrically connects to the second electrical connector of the wire harness;
wherein the downward viewing camera, with the mounting base attached at the side of the vehicle, electrically connects to the third electrical connector of the wire harness;
wherein, with the mounting base attached at the side of the vehicle, and with the electronic accessory electrically connected to the first electrical connector of the wire harness, the electronic accessory is electronically connected to an electrical power source of the vehicle for delivering electrical power from the electrical power source to the electronic accessory;
wherein, with the mounting base attached at the side of the vehicle, and with the rearward viewing camera electrically connected to the second electrical connector of the wire harness, the rearward viewing camera (i) receives electrical power from the electrical power source via the wire harness and (ii) provides image data captured by the respective camera of the plurality of cameras to an electronic control unit (ECU) disposed at the vehicle; and
wherein, with the mounting base attached at the side of the vehicle, and with the downward viewing camera electrically connected to the third electrical connector of the wire harness, the downward viewing camera (i) receives electrical power from the electrical power source via the wire harness and (ii) provides image data captured by the respective camera of the plurality of cameras to the ECU.

22. The vehicular exterior rearview mirror assembly of claim 21, wherein the wire harness passes along the frame portion of the mounting base and within the interior portion of the housing.

23. The vehicular exterior rearview mirror assembly of claim 21, wherein the plurality of cameras are mounted at a bracket attached to the frame portion, and wherein each camera of the plurality of cameras is disposed at a respective aperture formed through the housing.

24. The vehicular exterior rearview mirror assembly of claim 21, comprising a lens washer disposed at the mounting base, wherein the lens washer comprises a nozzle that, with the mounting base attached at the side of the vehicle, is in fluid communication with a pressurized fluid source of the vehicle, and wherein the lens washer is operable to direct pressurized fluid from the nozzle toward a lens of one or more cameras of the plurality of cameras.

25. The vehicular exterior rearview mirror assembly of claim 24, wherein, with the mounting base attached at the side of the vehicle, a fluid conduit that is in fluid communication with the pressurized fluid source passes along the mounting base and fluidly connects to the nozzle of the lens washer.

26. The vehicular exterior rearview mirror assembly of claim 21, wherein the electronic accessory comprises a light source that, when electrically operated to emit light, emits light that is viewable exterior the mirror head.

27. A vehicular exterior rearview mirror assembly, the vehicular exterior rearview mirror assembly comprising:
   a mirror head accommodating a mirror reflective element;
   a mounting base configured for attachment at a side of a vehicle, wherein the mirror head is mounted at and is adjustable about the mounting base;
   wherein, with the mounting base attached at the side of the vehicle, the mirror head is movable relative to the mounting base between at least (i) an extended position where the mirror head is extended outward from the side of the vehicle so that the mirror reflective element is positioned to provide a rearward view at the side of the vehicle to a driver of the vehicle and (ii) a folded position where the mirror head is folded inward from the extended position toward the side of the vehicle;
   an actuator, wherein, with the mounting base attached at the side of the vehicle, the actuator is electrically operable to move the mirror head relative to the mounting base;
   wherein, with the mirror head in the extended position to provide the rearward view to the driver of the vehicle, and when the actuator is electrically operating to adjust the mirror head relative to the mounting base, the mirror reflective element moves in tandem with the mirror head relative to the mounting base to adjust the rearward view provided to the driver of the vehicle;
   a plurality of cameras disposed at the mounting base, wherein the plurality of cameras, with the mounting base attached at the side of the vehicle, are operable to capture image data;
   wherein the mounting base comprises (i) a frame portion that attaches at the side of the vehicle and (ii) a housing that is attached to the frame portion and that accommodates the plurality of cameras and the frame portion at an interior portion of the housing;
   wherein individual cameras of the plurality of cameras are attached to the frame portion;
   wherein the housing comprises a first housing portion and a second housing portion that join together to encase the frame portion and the plurality of cameras at the interior portion of the housing;
   wherein the plurality of cameras comprises (i) a rearward viewing camera that, with the mounting base attached at the side of the vehicle, views at least rearward of the vehicle and (ii) a downward viewing camera that, with the mounting base attached at the side of the vehicle, views at least downward;
   wherein the mirror head accommodates a plurality of electronic accessories of the vehicular exterior rearview mirror assembly;
   wherein a first electronic accessory of the plurality of electronic accessories comprises the actuator;
   wherein a second electronic accessory of the plurality of electronic accessories comprises a light source that, when electrically operated to emit light, emits light that is viewable exterior the mirror head;
   a wire harness passing through the mounting base to the mirror head, wherein the wire harness has a plurality of individual wires, and wherein wires of the plurality of individual wires terminate at respective first, second, third, and fourth electrical connectors;
   wherein, with the mounting base attached at the side of the vehicle, the first electronic accessory at the mirror head electrically connects to the first electrical connector of the wire harness;
   wherein, with the mounting base attached at the side of the vehicle, the second electronic accessory at the mirror head electrically connects to the second electrical connector of the wire harness;
   wherein the rearward viewing camera, with the mounting base attached at the side of the vehicle, electrically connects to the third electrical connector of the wire harness;
   wherein the downward viewing camera, with the mounting base attached at the side of the vehicle, electrically connects to the fourth electrical connector of the wire harness;
   wherein, with the mounting base attached at the side of the vehicle, and with the first electronic accessory electrically connected to the first electrical connector of the wire harness, the first electronic accessory is electronically connected to an electrical power source of the vehicle for delivering electrical power from the electrical power source to the first electronic accessory;
   wherein, with the mounting base attached at the side of the vehicle, and with the second electronic accessory electrically connected to the second electrical connector of the wire harness, the second electronic accessory is electronically connected to the electrical power source of the vehicle for delivering electrical power from the electrical power source to the second electronic accessory;
   wherein, with the mounting base attached at the side of the vehicle, and with the rearward viewing camera electrically connected to the third electrical connector of the wire harness, the rearward viewing camera (i) receives electrical power from the electrical power source via the wire harness and (ii) provides image data captured by the respective camera of the plurality of cameras to an electronic control unit (ECU) disposed at the vehicle; and
   wherein, with the mounting base attached at the side of the vehicle, and with the downward viewing camera electrically connected to the fourth electrical connector of the wire harness, the downward viewing camera (i) receives electrical power from the electrical power source via the wire harness and (ii) provides image data captured by the respective camera of the plurality of cameras to the ECU.

28. The vehicular exterior rearview mirror assembly of claim 27, wherein the wire harness passes along the frame portion of the mounting base and within the interior portion of the housing.

29. The vehicular exterior rearview mirror assembly of claim 27, wherein the light source, when electrically operated to emit light, emits light at least downward and along the side of the vehicle to at least partially illuminate a ground surface along the side of the vehicle.

30. The vehicular exterior rearview mirror assembly of claim 29, wherein the light source illuminates an icon or logo at the ground surface along the side of the vehicle.

31. The vehicular exterior rearview mirror assembly of claim 27, wherein the light source, when electrically operated to emit light, emits light at least sideward from the side of the vehicle to provide a floodlight or spotlight of the vehicle.

32. The vehicular exterior rearview mirror assembly of claim 27, wherein the light source, when electrically operated to emit light, provides a turn signal indicator of the vehicle.

33. The vehicular exterior rearview mirror assembly of claim 27, wherein the light source, when electrically operated to emit light, provides a blind zone indicator of the vehicle.

\* \* \* \* \*